(12) United States Patent
Young

(10) Patent No.: US 6,677,594 B1
(45) Date of Patent: Jan. 13, 2004

(54) SCANNING WHEEL FOR ION IMPLANTATION PROCESS CHAMBER

(75) Inventor: Stephen Gary Young, Shoreham By Sea (GB)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/522,916

(22) Filed: Mar. 10, 2000

(30) Foreign Application Priority Data

Mar. 11, 1999 (GB) .............................................. 9905620

(51) Int. Cl.[7] .............................................. H01J 37/317
(52) U.S. Cl. .............................. 250/442.11; 250/440.11; 250/441.11; 250/443.11; 250/452.1; 250/492.3; 250/492.21; 414/217; 414/417
(58) Field of Search ........................ 250/492.21, 441.1, 250/442.11, 443.11, 440.11, 441.11; 414/217, 417

(56) References Cited

U.S. PATENT DOCUMENTS

| | | | | |
|---|---|---|---|---|
| 4,776,744 A | * | 10/1988 | Stonestreet et al. | ......... 414/217 |
| 4,836,733 A | * | 6/1989 | Hertel et al. | ............. 414/744.5 |
| 4,911,103 A | * | 3/1990 | Davis et al. | ................. 118/725 |
| 5,040,484 A | * | 8/1991 | Mears et al. | ................. 118/503 |
| 5,389,793 A | * | 2/1995 | Aitken et al. | .......... 250/492.21 |
| 5,778,968 A | | 7/1998 | Hendrickson et al. | |

FOREIGN PATENT DOCUMENTS

| | | |
|---|---|---|
| EP | 0178803 A | 4/1986 |
| EP | 0421728 A2 | 4/1991 |
| EP | 0452041 A1 | 10/1991 |
| EP | 0556865 A1 | 8/1993 |
| GB | 2180093 A | 3/1987 |
| JP | 10177964 | 6/1998 |
| WO | 88/09563 A | 12/1988 |

* cited by examiner

Primary Examiner—John R. Lee
Assistant Examiner—David A. Vanore
(74) Attorney, Agent, or Firm—Boult Wade Tennant

(57) ABSTRACT

A scan wheel for an ion implanter. The scan wheel having a plurality of wafer support elements each having an elastomer layer 7 on which a wafer is supported. Each wafer support element 3 has a plurality of spring loaded plungers 10 of a material having a lower coefficient of friction than that of the elastomer layer 7 so as to support a wafer such that it can be slid across the wafer support element 3 without sticking to the elastomer layer 7. A position detector 33 can be provided on a gripper which mounts each wafer on a wafer support element to detect that the wafer has been correctly positioned.

18 Claims, 4 Drawing Sheets

SCANNING WHEEL FOR ION IMPLANTATION PROCESS CHAMBER

The present invention relates to improvements in scanning wheels used in ion implantation process chambers.

Ion implantation is used for doping semi-conductor materials to achieve desired conductivity states. A beam of ions of a desired species for implantation is formed and directed at the surface of a semi-conductor wafer for implantation therein. In batch processing ion implanters, it is usual practice to arrange for a batch of semi-conductor wafers to be processed simultaneously, and for these wafers to be repeatedly scanned throughout the ion beam to ensure a homogenous distribution of ions over the surfaces of the wafers.

U.S. Pat. No. 5389793 discloses a scan wheel used for scanning a batch of wafers in the process chamber of an ion implanter. This scan wheel has a plurality of wafer support elements circumferentially disposed about the axis about which the scan wheel rotates. A respective heat sink insert is mounted to each wafer support element and an elastomer layer is provided on the surface of the heat sink insert which will receive the wafer to provide good thermal, contact between the wafer and the heat sink insert.

When the wheel is loaded with wafers, a gripper arm presents a wafer to the heat sink insert and presses it against the elastomer layer. A pair of spring loaded clips then push the wafer across the elastomer layer into contact with a fixed restraint forming part of the wafer support element. Once the wafer is in place, the gripper arm releases the wafer which is then held between the spring loaded clips and the fixed restraint.

One problem with this arrangement is that the wafer tends to stick to the elastomer layer and is therefore not properly pushed into the correct location by the clips. However, the operating mechanism detects that a cylinder driving the clips has been moved and therefore assumes that the wafer is in the correct position. When the gripper arm is released, the clips then push the wafer across the elastomeric layer in an uncontrolled manner such that the wafer is not properly engaged with the fixed restraint. This may cause damage to the wafer, or may mean that the wafer is insecurely held such that it is thrown from the wafer support element when the wheel is spun up. Any attempt to increase the force provided by the clips to prevent the wafer sticking introduces a risk that the wafer will be damaged by being driven too hard into the fixed restraint.

As the scan wheel rotates at high speed, it is not practical to have any electronics on the scan wheel itself to detect the position of the wafer. However, as the water is not always fully moved into the correct position until after the gripper is released, it is also not possible to provide a detector on the gripper to ensure that the wafer is in the correct position. With the prior art, therefore, if a wafer is incorrectly positioned on the wheel, this is impossible to detect.

In one attempt to overcome these problems, a pair of elastomer bumps have been provided on the elastomer layer in order to support the wafer away from the elastomer layer when is it slid into position. The elastomer bumps are compressible so that they are squashed by the wafer when the machine is spun up to ensure a good thermal contact between the wafer and the elastomeric layer. However, these bumps proved to be counter-productive in practice as the wafers tended to pivot around the bumps when they were pushed into position, thereby taking the wafer even further away from its correct position.

According to a first aspect of the present invention there is provided a scan wheel for an ion implanter adapted for carrying a plurality of semi-conductor wafers, the scan wheel being rotatable about an axis for scanning wafers carried by the wheel across an ion beam, the scan wheel comprising a plurality of wafer support elements disposed circumferentially about the axis, each wafer support having a wafer supporting surface covered with an elastomer layer, and a plurality of projections which are resiliently biased such that they protrude beyond the elastomer layer to receive a wafer, wherein the coefficient of friction between the material of the projections and the backside of a wafer is less than that between the material of the elastomer layer and the backside of the wafer.

Thus, when a wafer is loaded onto a wafer support, it is received on the projections and can therefore be readily pushed across the wafer support into the correct position. As the wafer slides across projections having a low coefficient of friction, rather than sliding across an elastomer layer having a relatively high coefficient of friction, the wafer will not tend to stick and will be pushed into place reliably. Once the wheel is spun up, centrifugal forces will push the wafer down onto the elastomer layer against the action of the resiliently biased projections, thereby ensuring good thermal contact between the wafer and the elastomer layer.

A further problem with the elastomer bumps as used in the prior art is that the restoring force that they exert against the back of the wafer is unpredictable as the force required to collapse them is unpredictable. The inconsistency is such that, in certain cases, the elastomer bumps will not collapse even when the scan wheel is spun up.

According to the second aspect of the present invention there is provided a scan wheel for an ion implanter adapted for carrying a plurality of semi-conductor wafers, the scan wheel being rotatable about an axis for scanning wafers carried by the wheel across an ion beam, the scan wheel comprising a plurality of wafer support elements disposed circumferentially about the axis, each wafer support having a wafer supporting surface covered with an elastomer layer, and a plurality of projections which protrude beyond the elastomer layer to receive a wafer, each projection comprising a rigid plunger which receives the wafer, and a resilient element biasing the rigid plunger into the protruding position when unloaded. With this arrangement, the plunger and resilient elements are provided as separate entities, so that the resilient element can be selected entirely on the strength of the biasing force that it provides, thereby allowing a high degree of consistency to be achieved for the restoring force.

By avoiding sliding the wafer across the elastomer layer, particle build up on the back of the wafer is reduced and wear of the layer is reduced thereby prolonging the life of the layer.

The resilient projections also help to push the treated wafer away from the wafer support elements once the wheel has stopped spinning. This reduces the chances of a wafer sticking to the elastomer layers and therefore reduces the damage caused when a wafer is unstuck from the wafer support element.

Further, as the wafer can be reliably slid into the correct position, a gripper arm which brings the wafer to the wafer support element can be provided with a position detecting means so that confirmation can be obtained that the wafer has indeed been correctly positioned. Thus, even if the wafer is not initially correctly positioned, it is possible to make a further attempt to correctly position the wafer, or to alert an operator that the wafer is incorrectly positioned. In the prior art, this was not possible, and the first indication that a wafer was incorrectly positioned was when it flew off the wheel when the wheel was spinning.

Conventionally, a wafer support element will have a heat sink insert on which the elastomer layer is provided. The invention therefore extends to a heat sink insert for a wafer support element, the heat sink insert having a wafer supporting surface covered with an elastomer layer, and a plurality of projections which are resiliently biased such that they protrude beyond the elastomer layer to receive a wafer wherein the coefficient of friction between the material of the projections and the backside of a wafer is less than that between the material of the elastomer layer and the backside of the wafer.

The invention also extends to a heat sink insert for a wafer support element, the heat sink insert having a wafer supporting surface covered with an elastomer layer, and a plurality of projections which are resiliently biased such that they protrude beyond the elastomer layer to receive a wafer, each projection comprising a rigid plunger which receives the wafer, and a resilient element biasing the rigid plunger into the protruding position when unloaded.

In order to provide good support for the wafer, it has been found preferable to provide at least three projections spaced from and disposed around the centre of the wafer support element. If the wafer support element is substantially circular when viewed in plan and has a first side from which the wafer is pushed, a second side where the fixed restraint is positioned, and a centre line passing through the centre of the wafer support element and extending from the first side to the second side, the optimum arrangement of projections is to have a pair of projections positioned towards the first side, and on opposite sides of the centre line, and to have a third projection positioned on the centre line and towards the second side.

More preferably, five of more projections are provided in order to make sure that there is no chance of the wafer ever coming into contact with the elastomer during the loading process. In the case of five projections, the first three projections are disposed as mentioned above, and two further projections are provided, one on each side of the centre line, and disposed closer to the first side than is the third projection.

A material for the elastomer layer maybe , for example, polyurethane, polyamide, polyimide or polystyrene and is preferably silicone rubber as disclosed in Japanese patent application No. HEI 10-177964.

In order to ensure that the wafer impinges upon the fixed restraint at the desired height, it is preferable for the projections closer to the first side to project further from the elastomer layer than the projections closer to the second side. This ensures that the wafer is slid in a direction in which it is inclined downwardly towards the fixed restraint. This helps to ensure engagement of the wafer with respect to the fixed restraint and prevents the wafer from being forced up over the fixed restraint.

Each projection preferably takes the form of a spring loaded plunger. Preferably, the head of the plunger is profiled such that a dome shape surface projects from the elastomer layer. This provides a small contact area between the projection and the wafer, and also ensures that there are no corners which might catch the wafer. Preferably, the plunger also has an annular recess below the dome shape surface. In practice, any contaminants which collect on the dome shape surface are dislodged during use and work their way down into the annular recess where they are stored out of harms way. The plunger can then be removed periodically for cleaning or replacement.

The wafer support element preferably has a through bore in which the spring loaded plunger is located. The spring loaded plunger is preferably held in place by a circlip which is fitted into an annular recess in the through bore. This allows the spring loaded plunger to be very easily removed for cleaning or replacement.

The projections may be made of any material over which the wafer can readily slide. The most suitable material is a low particle shedding plastic such as PEEK as this is resistant to wear, but will not scratch the backside of a wafer.

The present invention also extends to an ion implanter having a scan wheel for carrying a plurality of semiconductor wafers, the scan wheel being rotatable about an axis for scanning the wafers carried by the wheel across an ion beam, the scan wheel comprising a plurality of wafer support elements disposed circumferentially about the axis, each wafer support having a wafer supporting surface covered with an elastomer layer, a mechanism for sliding the wafer across the supporting surface and means on the supporting surface for facilitating the sliding of the wafer across the supporting surface; and a gripper for taking a wafer from a stock of wafers, and placing it on the wafer support element, the gripper having a detector for detecting that the wafer has been slid into the correct position by the mechanism for sliding the wafer across the supporting surface.

Thus, if the wafer is not moved to the correct position, this can be detected. This allows the implanter either to attempt one or more further times to move the wafer to the correct position or to alert an operator that a wafer is out of position.

The detector can be any conventional position detector. However, the means for detecting the position is preferably a strain gauge provided on a part of the gripper which is deflected as the gripper grips the wafer. Such a detector can also be used to detect that the wafer is always in the correct position, for example when the wafer is picked up from the stock of wafers, or if the wafer is pushed too far across the wafer support element indicating mechanical damage to the fixed restraint.

A scan wheel constructed in accordance with the present invention will now be described with reference to the accompanying drawings, in which.

As mentioned previously U.S. Pat. No. 5389793 discloses an ion implantation apparatus which includes a scan wheel for scanning a batch of wafers through an ion beam in a process chamber. The disclosure of the above U.S. specification is incorporated herein by reference.

Figure 1:
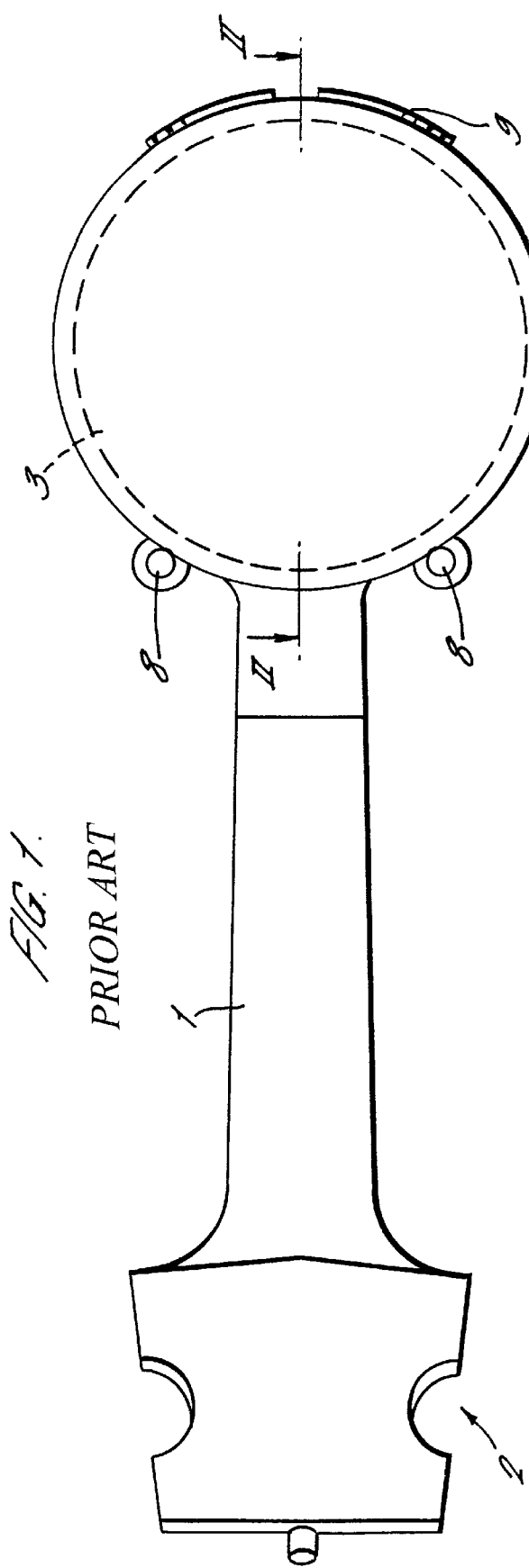
FIG. 1 is a front view of one arm of the scan wheel to which the present invention can be applied.
Figure 2:
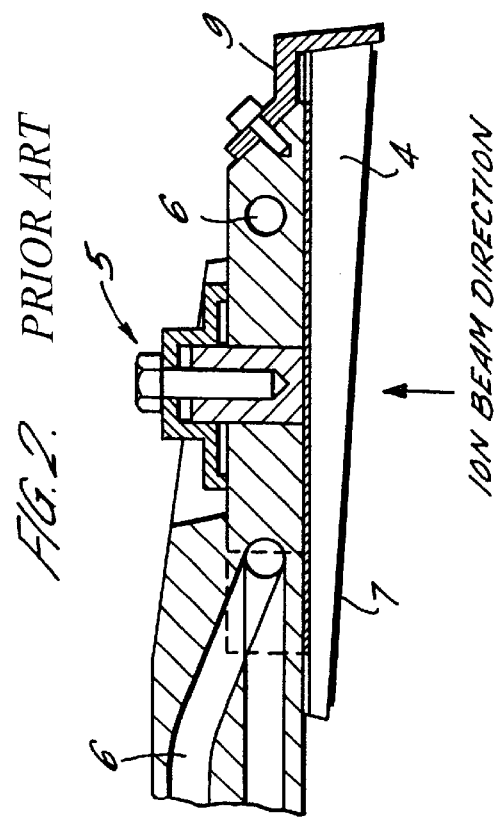
FIG. 2 is a cross-section through line II—II of FIG. 1.

FIGS. 1 and 2 are taken from U.S. 5389793 and show a wafer support element to which the present invention can be applied.

The scan wheel comprises a plurality of arms 1 bolted at one end 2 to a central hub (not shown). The radially outer end of the arm 1 has a wafer support element 3 to which a heat sink insert 4 is mounted by a stud arrangement 5 as described in U.S. Pat. No. 5389793. Coolant is circulated through passages 6 to cool the wafer support element.

The surface of the heat sink insert on which the wafer is to be mounted is covered with an elastomer layer 7. A wafer is mounted on the elastomer layer 7 in a manner to be described and is held in place by a pair of clamping clips 8 which co-operate with a fixed restraint 9 at the radially outermost edge of the wafer support element 3 to hold the wafer in place while the wheel is spun and irradiated with an ion beam in the direction shown in FIG. 2.

Figure 3:
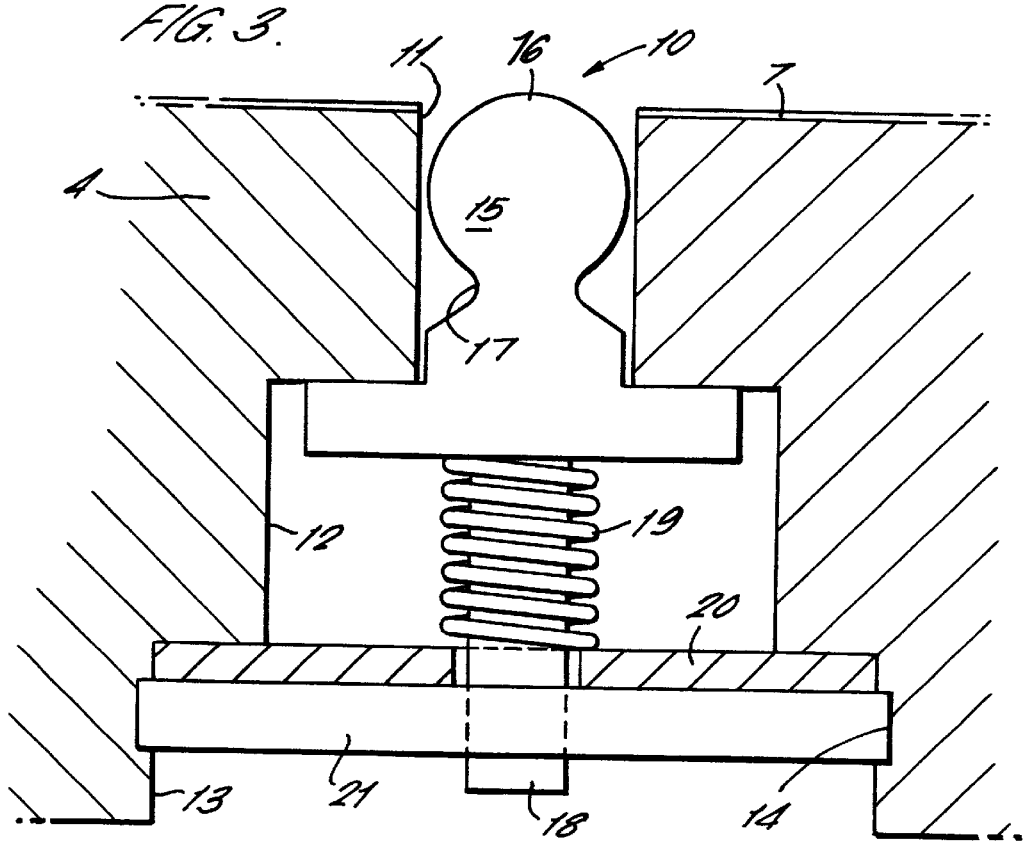
FIG. 3 is a cross-section through one plunger assembly.
Figure 4:
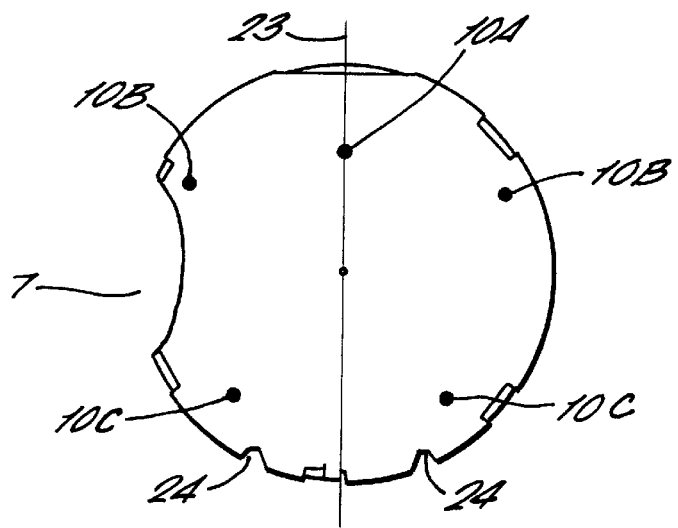
FIG. 4 is a plan view of an insert showing the location of the plunger assemblies.
Figure 7:
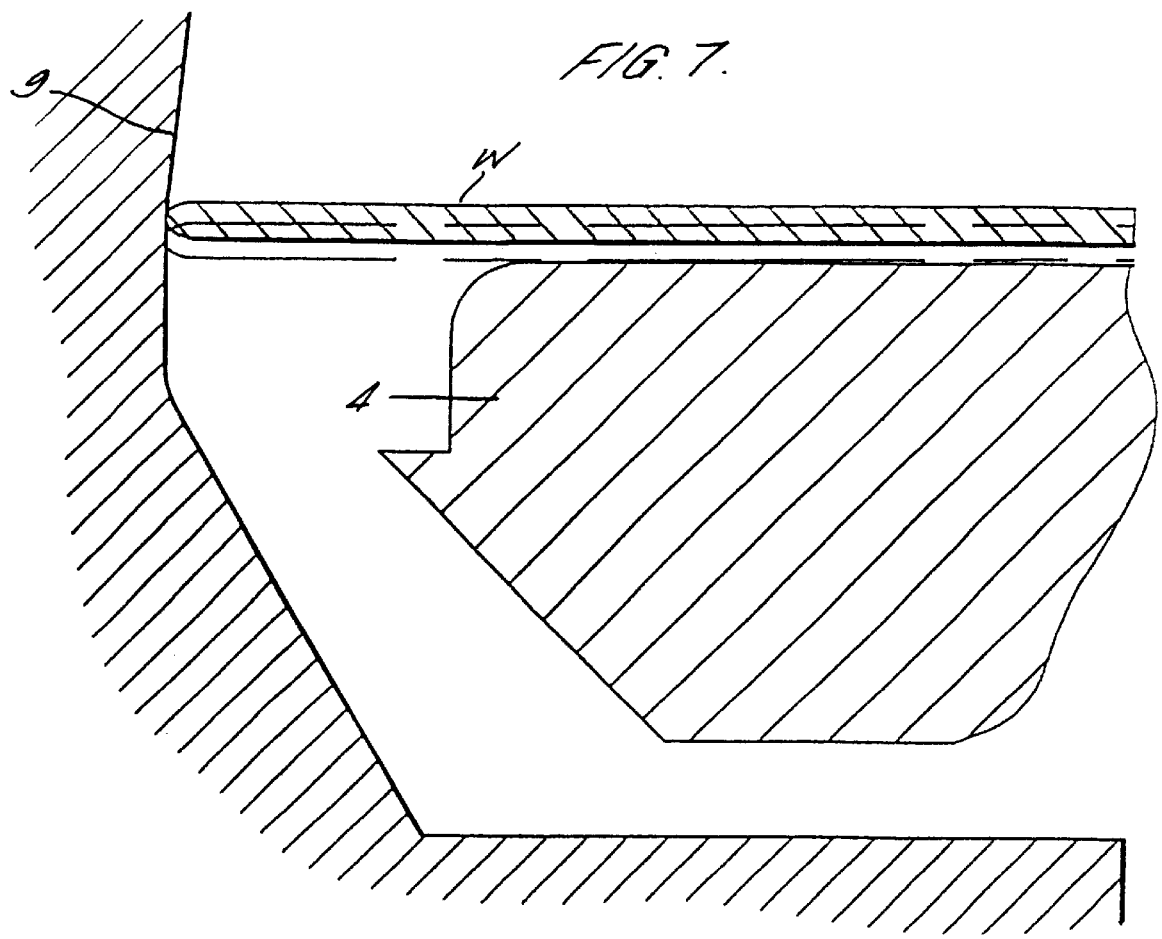
FIG. 7 is a schematic cross-section through a part of the heat sink insert, wafer and fixed restraint.

The wafer support surface of the preferred embodiment of the present invention is shown in FIG. 4. The wafer support surface can be coated on a heat sink base 4, as shown in FIG. 7. To keep the wafer from sitting on the elastomer surface, a plurality of plunger assemblies protrude beyond the elastomer layer. FIG. 3 displays a plunger assembly. [The heat sink insert 4 is provided with a plurality of plunger assemblies 10 as shown in FIG. 3.] Each plunger assembly is retained in a through bore 11 within the insert 4. The through bore 11 has a pair of countersunk bores 12, 13 producing a stepped increase in the size of the bore towards the back surface of the insert 4. The counterbore 13, adjacent to the back surface of the insert 4 is provided with a circumferential groove 14. The plunger assembly comprises a plunger 15 having a substantially spherical head 16 leading downwardly to a constricted neck 17. A spigot 18 projects at the rear surface of the plunger element 15 and is surrounded by a coiled spring 19. The coiled spring 19 acts against a washer 20 which is held in place by a circlip 21 retained in circumferential groove 14 to urge the plunger 15 into the position shown in FIG. 3 in which the top of the head 16 projects beyond the elastomer layer 7. In use, any contaminants which are deposited on the head 16 will work their way down into the constricted neck 17 during the course of normal operation, where they are retained out of harms way.

Optimally, five plunger assemblies 10 are provided at the locations on the insert as shown in FIG. 4. The insert has a centre line 23 extending through the centre of the insert in the direction in which the wafer is slid across the insert. The arrangement of plungers is symmetrical about this centre line. The insert has a pair of recesses 24 which receive respective clamping clips 8 to allow the wafer to be pushed across the insert. A first plunger assembly 10A is provided on the centre line and is closest to the side of the insert which faces the fixed restraint 9. A pair of second plunger assemblies 10B are provided furthest from the centre line and spaced slightly further from the fixed restraint 9 than the first plunger assembly 10A. A pair of third plunger assemblies 10C are disposed closer to the centre line 23 than the pair of second plunger assemblies 10B, and are positioned adjacent to the side of the insert provided with the grooves 24. In practice, the plungers of the third plunger assemblies 10C are arranged to project further from the elastomer layer 7 than the remaining plunger assemblies so that when the wafer is loaded onto the insert it is inclined towards the elastomer layer in the direction towards the fixed restraint 9. Typically, in the unloaded condition, the first and second plunger assemblies will project 0.3–0.4 mm above the elastomer layer and the third plunger assemblies will project 0.6–0.8 mm above the elastomer layer.

Figure 5:
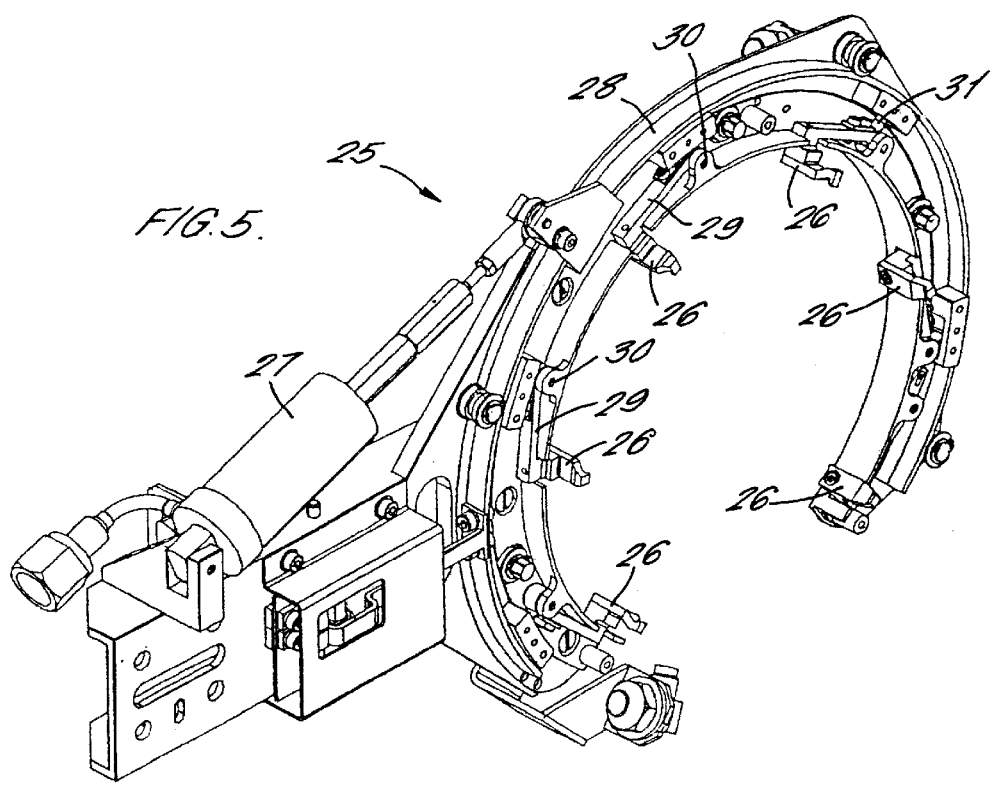
FIG. 5 is a perspective view of a gripper arm.
Figure 6:
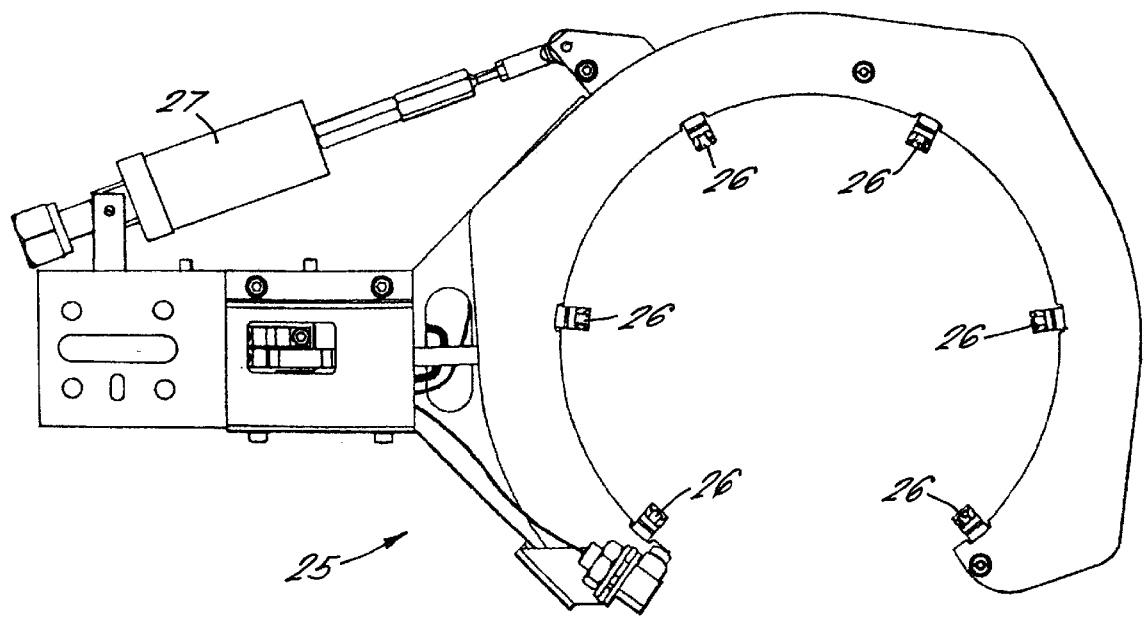
FIG. 6 is a plan view of the gripper arm of FIG. 5.

Individual wafers are loaded onto each heat sink insert using the gripper arm 25 as shown in FIGS. 5 and 6. The gripper arm has six circumferentially disposed gripper fingers 26 for gripping the edge of a circular wafer. The gripper fingers 26 are synchronously moved radially inwardly and outwardly by pneumatic cylinder 27 via a conventional system of mechanical linkages. The mechanical linkage comprises a circumferential collar 28 which surrounds all of the gripper fingers 26 and is circumferentially moveable. Each of the gripper fingers is mounted on a gripper support 29 about a pivot point 30 on the main body of the gripper. A plate spring 31 projects from each gripper support 29 and is retained in a slot in the collar 28. Thus, when the collar 28 is circumferentially moved by the pneumatic cylinder 27, all of the gripper fingers 26 will be moved synchronously by virtue of each plate spring 31 causing the respective gripper support 29 to pivot about its pivot point 30. The plate springs 31 provide the necessary give in the gripper fingers to avoid damage to a wafer.

Figure 8:
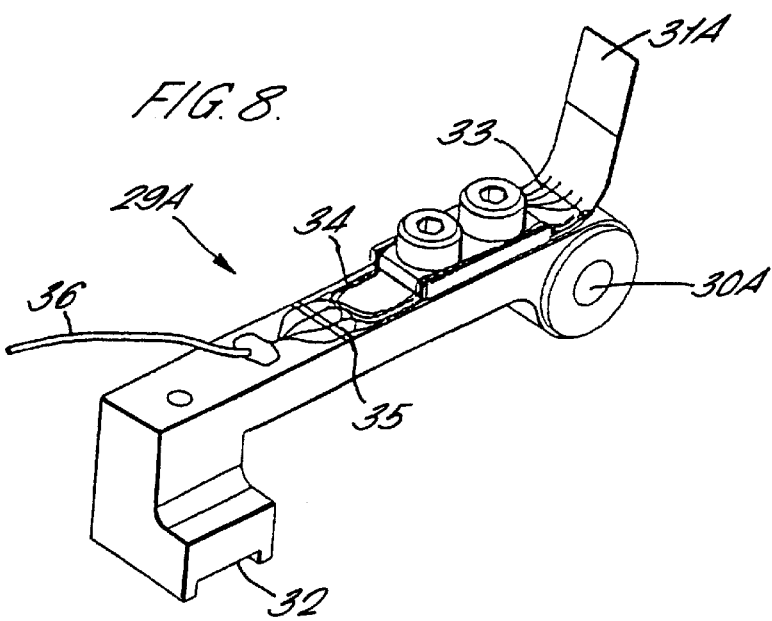
FIG. 8 is a perspective view of a gripper support.

The present invention allows one of the gripper supports 29 to be replaced with the gripper support 29A as shown in FIG. 8. The modified gripper support 29A is similar in construction to the gripper supports 29 shown in FIG. 5, in that it pivots around point 30A, has a gripper finger (not shown, but having a structure the same as that in FIG. 5) mounted to surface 32 and a plate spring 31A which extends to a slot in the collar 28. In addition, the modified gripper support 29A has a strain gauge 33 mounted to the plate spring 31A. FIG. 8 shows a strain gauge mounted to the upper surface of the plate spring 31A, but a further strain gauge of similar construction is mounted to the rear surface of the plate spring 31A. The strain gauge 33 is connected via interbridge wire 34 and a terminal pad 35 to a lead wire 36 welded to the gripper support 29A and connected to the control system of the machine. The strain gauge 33 produces a signal in proportion to the displacement of the plate spring 31A allowing the position of the gripper finger attached to the gripper for support 29A to be constantly monitored.

The loading operation of a wafer onto the heat sink insert will now be described. The operation begins with the gripper assembly 25 moving to a magazine of wafers where the circumferential collar 28 is moved causing the gripper fingers 26 to move radially inwardly and grasp the circumferential edge of a wafer. At this stage, as the position of one of the gripper fingers can be detected using the strain gauge 33, the machine can verify that the wafer has been correctly gripped. The gripper arm 25 then moves to the wafer support element 3 and holds the wafer on the heat sink insert 4 with the wafer and heat sink insert both in a vertical position. At this time, the wafer is supported on the five projections 10 and is therefore held away from the elastomer layer 7. The two clamping clips 8 then move into respective recesses 24 to push the wafer across the heat sink insert and hold it against the fixed restraint 9. As the wafer is only in contact with the heat sink insert via the heads 16 of the five plungers 15, and as these have a lower coefficient of friction than the elastomer layer 7, the wafer will not stick as it is slid across the heat sink inserts 4. This ensures that the wafer will be reliably slid into correct engagement with the fixed restraint 9 while still being held in place by the gripper fingers 26. When the wafer is in the correct position, a pre-determined strain will be detected by the strain gauge 33 allowing the machine to verify that the wafer has reached its correct position.

If the clamping clips 8 have been activated and the strain gauge 33 gives an abnormal reading indicating that the wafer is not in the correct position, the clips can be retracted and activated again in an attempt to move the wafer into the correct position. If this is still unsuccessful, the machine can alert an operator to the fact that a wafer has been incorrectly mounted.

Because the pair of third plungers 10C project further from the elastomer layer 7 than the remaining projections, the wafer will be loaded such that it slopes downwardly towards the elastomer layer 7 towards the fixed restraint 9. In other words, the wafer W will slope downwardly from right to left as shown in FIG. 7. This ensures that it will always engage at the correct height on the fixed restraint 9, and that the spin force will not force the wafer upwardly away from the insert 4 or cause excessive stress on the wafer edge closest to the restraint. Once the strain gauge 33 has verified the correct positioning of the wafer, the gripper fingers 26 can be radially retracted by the pneumatic cylinder 27 and circumferential collar 28 co-operating with the gripper supports 29, whereupon the gripper arm 25 can return to the wafer magazine to collect the next wafer. The loaded wafer is held in place by the fixed restraint 9 and clamping fingers 8.

Once a wafer has been loaded onto each of the wafer support elements 3 the scan wheel can be spun up to scan the wafers with the ion beam. Because the support surface of the heat sink insert is canted towards the arm 1, the rotation of the wheel will create a centrifugal force which tends to push the wafer towards the heat sink insert 4. This will cause the wafer to rotate about the point of contact with the fixed restraint 9 forcing the wafer down onto the heat sink insert 4. This pushes the plungers 15 into the heat sink insert 4, to ensure good thermal contact between the wafer and the elastomer layer 7 for cooling the wafer during the scanning operation.

I claim:

1. A scan wheel for an ion implanter adapted for carrying a plurality of semi-conductor wafers; the scan wheel being rotatable about an axis for scanning wafers carried by the wheel across an ion beam, the scan wheel comprising a plurality of wafer supports disposed circumferentially about the axis so as to move in a circular path on rotation of the scan wheel; each wafer support having a wafer supporting surface covered with an elastomer layer, said wafer supporting surfaces being canted inwards towards said wheel axis, so that on rotation of the wheel centrifugal force presses wafers against said surfaces, and a plurality of projections mounted in and movable with the respective wafer support, said projections extending through the elastomer layer and being resiliently biased such that they protrude beyond the elastomer layer to engage the backside of a wafer on said support surface to hold the wafer away from the elastomer layer in the absence of said centrifugal force; wherein the coefficient of friction between the material of the projections and the backside of a wafer is less than that between the material of the elastomer layer and the backside of the wafer.

2. A scan wheel according to claim 1, wherein the wafer support has at least three said projections spaced from and disposed around the centre of the wafer support element.

3. A scan wheel according to claim 2, wherein the wafer support element is substantially circular when viewed in plan and has a first side from which the wafer is pushed, a second side where the fixed restraint is positioned, and a centre line passing through the centre of the wafer support element and extending from the first side to the second side, and a pair of projections are positioned towards the first side, and on opposite sides of the centre line, and a third projection is positioned on the centre line and towards the second side.

4. A scan wheel according to claim 3 wherein two further projections are provided, one each side of the centre line, and disposed closer to the first side than is the third projection.

5. A scan wheel according to claim 2 wherein the support element has at least five projections spaced from and disposed around the centre of the wafer support element.

6. A scan wheel according to any one of claims 3 to 5, wherein the projections closer to the first side project further from the elastomer layer than the projections closer to the second side.

7. A scan wheel according to claim 1, wherein each projection is a spring loaded plunger.

8. A scan wheel according to claim 7, wherein the head of each plunger has a dome shape surface projecting from the elastomer layer.

9. A scan wheel according to claim 8, wherein the plunger has an annular recess below the dome shape surface.

10. A scan wheel according to any one of claims 7 to 9, wherein the spring loaded plunger is held in place by a circlip which is fitted into an annular recess in a through bore in the wafer.

11. A scan wheel according to claim 7, wherein the projection is made of a low particle shedding plastics material.

12. An ion implanter comprising a scan wheel according to claim 1 and a gripper arm which brings the wafer to the wafer support arm, the gripper arm having a position detecting means to detect the position of the wafer.

13. A scan wheel for an ion implanter adapted for carrying a plurality of semi-conductor wafers, the scan wheel being rotatable about an axis for scanning wafers carried by the wheel across an ion beam, the scan wheel comprising a plurality of wafer support elements disposed circumferentially about the axis so as to move in a circular path on rotation of the scan wheel; each wafer support having a wafer supporting surface covered with an elastomer layer, said wafer supporting surfaces being canted inwards towards said wheel axis, so that on rotation of the wheel centrifugal force presses wafers against said surfaces, and a plurality of projections mounted in and movable with the respective wafer support, said projections extending through the elastomer layer and being resiliently biased such that they protrude beyond the elastomer layer to engage the backside of a wafer on said support surface to hold the wafer away from the elastomer layer in the absence of said centrifugal force; each said projection comprising a rigid plunger which engages the backside of the wafer, and a resilient element biasing the rigid plunger into the protruding position when unloaded.

14. An ion implanter having a scan wheel for carrying a plurality of semi-conductor wafers; the scan wheel being rotatable about an axis for scanning the wafers carried by the wheel across an ion beam; the scan wheel comprising a plurality of wafer supports disposed circumferentially about the axis; each wafer support comprising a wafer supporting surface covered with an elastomer layer, a respective sliding mechanism operative to slide a wafer placed on the supporting surface across said surface to a predetermined required position on said support, and low friction projections on the supporting surface for facilitating the sliding of the wafer across the supporting surface; the ion implanter further comprising a gripper operative to grip and take a wafer from a stock of wafers, to place it on one of said wafer supports and to hold the wafer with a resilient grip as said respective sliding mechanism slides the wafer to said required position; the gripper having a detector operative to detect that the wafer has been slid into said required position, before the gripper releases the wafer.

15. An ion implanter according to claim 14, wherein the detector is a strain gauge provided on a part of the gripper which is deflected as the gripper grips the wafer.

16. A scan wheel according to claim 1, wherein at least one of said plurality of wafers supports includes a heat sink insert.

17. A scan wheel according to claim 13, wherein at least one of said plurality of wafer supports includes a heat sink insert.

18. A scan wheel according to claim 14, wherein at least one of said plurality of wafer supports includes a heat sink insert.

* * * * *